(12) United States Patent
Lee

(10) Patent No.: US 8,530,967 B2
(45) Date of Patent: Sep. 10, 2013

(54) LATERAL INSULATED-GATE BIPOLAR TRANSISTOR AND MANUFACTURING METHOD THEREOF

(75) Inventor: Sang Yong Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/463,181

(22) Filed: May 3, 2012

(65) Prior Publication Data

US 2013/0168728 A1 Jul. 4, 2013

(30) Foreign Application Priority Data

Dec. 29, 2011 (KR) .................. 10-2011-0145930

(51) Int. Cl.
*H01L 29/739* (2006.01)
(52) U.S. Cl.
USPC ............ 257/343; 257/E29.197; 257/E29.261; 257/E21.417; 438/286; 438/135
(58) Field of Classification Search
USPC .......... 257/139, E21.382, E29.197, E29.261, 257/343; 438/135, 297
See application file for complete search history.

(56) References Cited

U.S. PATENT DOCUMENTS

| 2006/0124994 A1 | 6/2006 | Jang et al. | |
|---|---|---|---|
| 2008/0210980 A1* | 9/2008 | Disney et al. | ................. 257/204 |
| 2008/0315251 A1 | 12/2008 | Lee | |

FOREIGN PATENT DOCUMENTS

| JP | 11-274312 | 10/1999 |
|---|---|---|
| KR | 10-2000-0014740 A | 3/2000 |
| KR | 10-0648276 | 11/2006 |
| KR | 10-2008-0111943 | 12/2008 |

* cited by examiner

*Primary Examiner* — Zandra Smith
*Assistant Examiner* — Paul Patton
(74) *Attorney, Agent, or Firm* — Sherr & Jiang, PLLC

(57) ABSTRACT

A lateral insulated-gate bipolar transistor includes a buried insulation layer which opens only part of the collector ion implantation region and isolates the other regions, thereby reducing the loss by the turn-off time. The lateral insulated-gate bipolar transistor further includes a deep ion implantation region formed to face towards the open part of the collector ion implantation region, thereby decreasing the hole current injected into a base region under an emitter ion implantation region, and thereby greatly increasing the latch-up current level by relatively increasing the hole current injected into the deep ion implantation region having no latch-up effect.

8 Claims, 9 Drawing Sheets

LATERAL INSULATED-GATE BIPOLAR TRANSISTOR AND MANUFACTURING METHOD THEREOF

The present application claims priority under 35 U.S.C. §119 to Korean Patent Application No. 10-2011-0145930 (filed on Dec. 29, 2011), which is hereby incorporated by reference in its entirety.

BACKGROUND

Generally, an insulated-gate bipolar transistor may have the characteristics of both the insulated gate structure of a metal oxide semiconductor (MOS), transistor and the high current density of a bipolar transistor. Such an insulated-gate bipolar transistor has been spotlighted as an alternative device which can overcome the problems of a complicated current control circuit and low switching speed of a bipolar transistor and a poor current control capability of a MOS transistor.

The insulated-gate bipolar transistor is taking over the field of power bipolar transistors and power MOS transistors because of the advantages, of a low forward voltage drop characteristic and a fast switching operation by gate driving.

Figure 1:
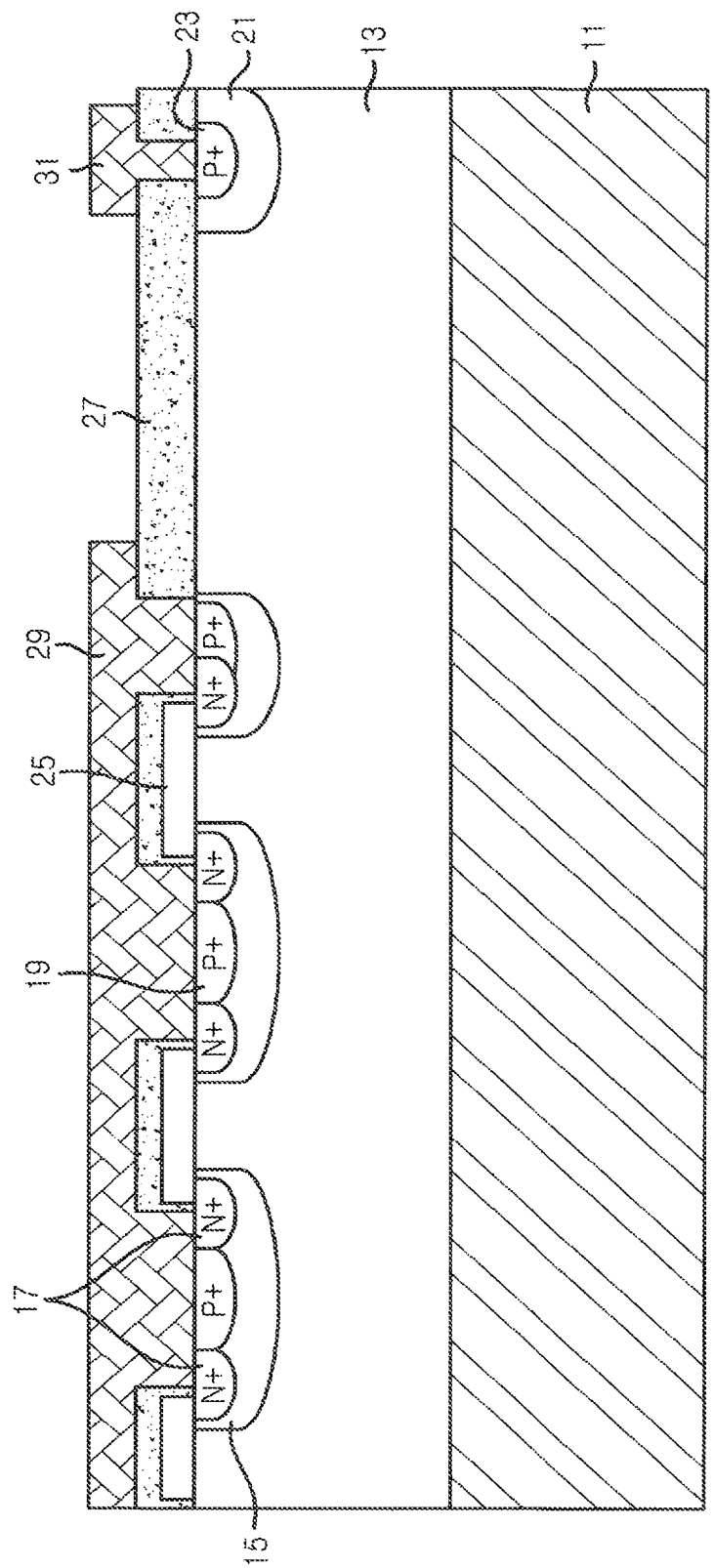

FIG. 1 is a cross-sectional view illustrating the structure of an insulated-gate bipolar transistor in accordance with the related art.

As illustrated in FIG. 1, the insulated-gate bipolar transistor may include an N-type drift region 13 formed in a semiconductor substrate 11, a P-type base region 15 formed in a predetermined surface area of the N-type drift region 13, highly doped N-type emitter ion implantation regions 17 formed in a predetermined surface area of the P-type base region 15, and a P-type ion implantation region 19 formed between and adjacent to the N-type emitter ion plantation regions 17. Further, the insulated-gate bipolar transistor may include an N-type buffer layer 21 formed in a predetermined surface area of the N-type drift region 13 so as to be spaced apart from the P-type base region 15 by a preset distance, and a P-type collector ion implantation region 23 formed in a predetermined surface area of the N-type buffer layer 21.

A gate insulation film (not shown) may be interposed between the P-type base regions 15 adjacent with each other on and/or over the surface of the semiconductor substrate 11 to form a gate electrode 25. An insulation layer 27 defining an emitter region and a collector region may be formed on and/or over the semiconductor substrate 11 where the gate electrode 25 is formed, an emitter electrode 29 may be formed in the emitter region to be connected to the N-type emitter ion implantation region 17, and a collector electrode 31 may be formed in the collector region to be connected to the P-type collector ion implantation region 23.

However, such an insulated-gate bipolar transistor has several problems to be mitigated and/or solved, such as a forward voltage drop caused by a region of a junction field effect transistor, a turn-off time delay caused by hole current at the time of turn-off, and the like.

SUMMARY

Embodiments relate to a lateral insulated-gate bipolar transistor, and more particularly, to a lateral insulated gate bipolar transistor, which can regulate the flow path of hole current injected through a collector thereof, and a manufacturing method thereof.

Embodiments relate to a lateral insulated-gate bipolar transistor, which can regulate the flow path of hole current injected through a collector thereof, thereby maintaining a low forward voltage drop of the insulated-gate bipolar transistor and reducing the effect of turn-off loss, which is in a trade-off relationship with the forward voltage drop characteristic, and a manufacturing method thereof.

Further, embodiments relate to a lateral insulated-gate bipolar transistor, which reduces the amount of hole current injected into a base region under an emitter ion implantation region to increase latch-up current level, and a manufacturing method thereof.

A lateral insulated-gate bipolar transistor in accordance with embodiments includes at least one of: a first conductive type collector ion implantation region formed at a preset depth in a second conductive type drift region formed in a first conductive type semiconductor substrate; a buried insulation layer formed to have an open area and a closed area on the interface between a top surface of the collector ion implantation region and the drift region; a first conductive type base region formed to face to the open area in the semiconductor substrate; a gate electrode formed between adjacent first conductive type base regions on the semiconductor substrate; a second conductive type emitter ion implantation region formed at side portions of the gate electrode in the semiconductor substrate; an insulation layer formed on a top surface of the semiconductor substrate including the gate electrode, a contact formed to penetrate the insulation layer and the closed area of the buried insulation layer and make contact with the collector ion implantation region; and an emitter electrode electrically connected to the emitter ion implantation region and a collector electrode electrically connected to the contact.

In embodiments, the lateral insulated-gate bipolar transistor may further include a first conductive type first ion implantation region formed in the first conductive type base region so as to be aligned with the open area.

In embodiments, the lateral insulated-gate bipolar transistor may further include a first conductive type second ion implantation region formed at side portions of the emitter ion implantation region in the first ion implantation region.

In embodiments, the buried insulation layer may include an oxide film.

A method for manufacturing a lateral insulated-gate bipolar transistor in accordance with embodiments includes at least one of forming a first conductive type collector ion implantation region at a preset depth in a second conductive type drift region formed in a first conductive semiconductor substrate; forming a buried insulation layer having an open area and a closed area on the interface between a top surface of the collector ion implantation region and the drift region; forming a first conductive type base region to face to the open area in the semiconductor substrate; forming a gate electrode between adjacent first conductive type base regions on the semiconductor substrate; forming a second conductive type emitter ion implantation region at side portions of the gate electrode in the semiconductor substrate; forming an insulation layer on the top surface of the semiconductor substrate including the gate electrode, forming a contact which penetrates the insulation layer and the closed area of the buried insulation layer and makes contact with the collector ion implantation region; and forming an emitter electrode electrically connected to the emitter ion implantation region and a collector electrode electrically connected to the contact.

Embodiments may further include: after forming the first conductive type base region, forming a first conductive type first ion implantation region in the base area so as to be aligned with the open area.

Embodiments may further include: after forming the emitter ion implantation region, forming a first conductive type second ion implantation region at side portions of the emitter ion implantation region in the first ion implantation region.

In Embodiments, the forming a buried insulation layer may include: forming a mask pattern defining the open area and the closed area on top of the semiconductor substrate; and implanting oxygen ions in the closed area using the mask pattern to form the buried insulation layer.

DRAWINGS

The above and other objects and features of embodiments will become apparent from the following description, given in conjunction with the accompanying drawings, in which;

FIG. 1 is a cross-sectional view illustrating the structure of an insulated-gate bipolar transistor in accordance with the related art.

Figure 2:
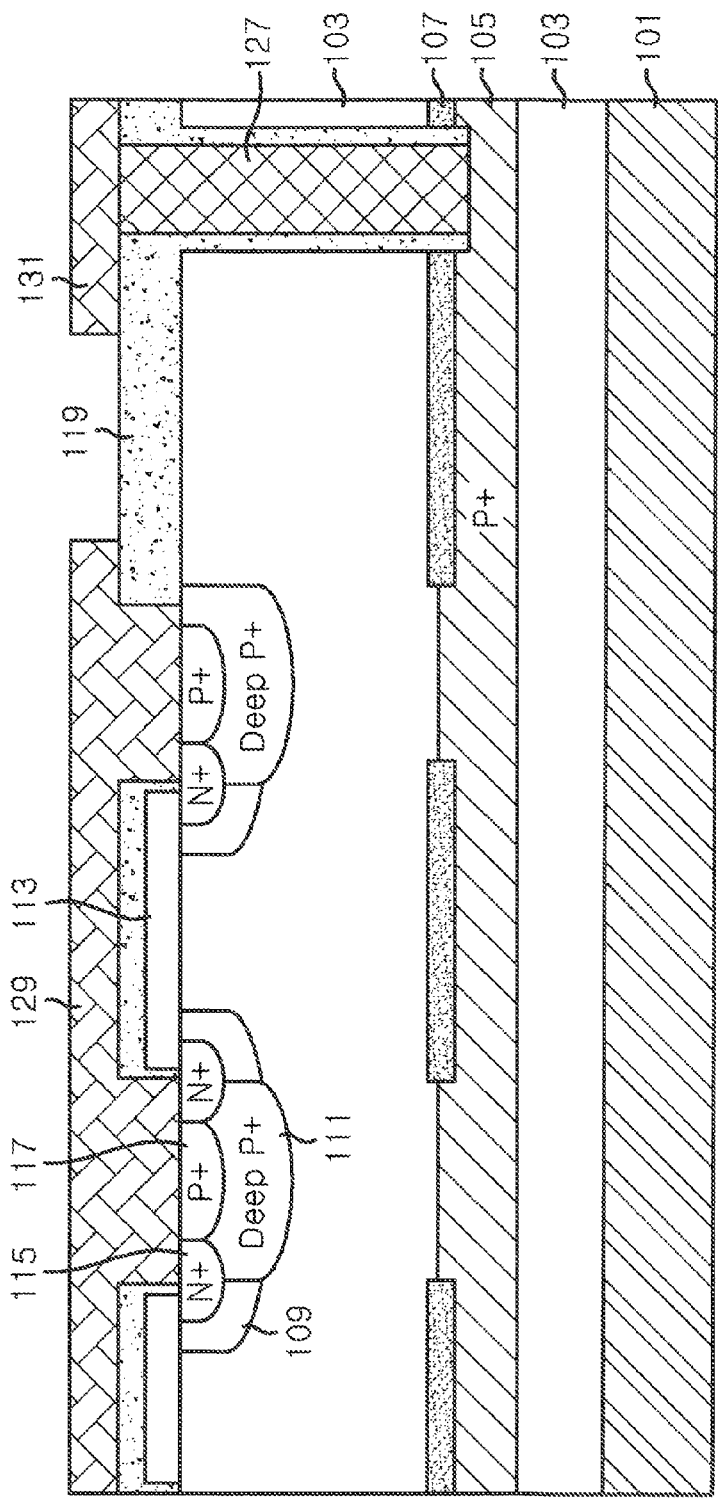

Example FIG. 2 is a cross-sectional view illustrating the structure of a lateral insulated-gate bipolar transistor in accordance with embodiments.

Example FIGS. 3 to 9 are cross-sectional views illustrating a method for manufacturing a lateral insulated-gate bipolar transistor in accordance with embodiments.

DESCRIPTION

The advantages and features of embodiments and methods of accomplishing these will be clearly understood from the following embodiments taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

Example FIG. 2 is a cross-sectional view illustrating the structure of a lateral insulated-gate bipolar transistor in accordance with embodiments.

As illustrated in example FIG. 2, the lateral insulated-gate bipolar transistor in accordance with embodiments may include a first conductive type collector ion implantation region 105 formed at a preset depth in a second conductive type drift region 103 formed on and/or over a first conductive type semiconductor substrate 101, and a buried insulation layer 107 formed to have an open area and a closed area on and/or over the interface between the top surface of the collector ion implantation region 105 and the drift region 103. By opening only part of the collector ion implantation region 105 and isolating the other regions through the use of the buried insulation layer 107, the flow path of hole current injected from a collector of the lateral insulated-gate bipolar transistor may be adjusted, thereby reducing the loss by turn-Off time for the lateral insulated-gate bipolar transistor.

Further, the lateral insulated-gate bipolar transistor in accordance with embodiments may include a first conductive type base region 109 formed in the semiconductor substrate 101 so as to face towards the open area where the buried insulation layer 107 is not formed, a first conductive type first deep ion implantation region 111 formed in the base region 109 so as to be aligned with the open area where the buried insulation layer 107 is, not formed, a gate electrode 113 formed between and adjacent to the base regions 109 on and/or over the semiconductor substrate 101, a second conductive type emitter ion implantation region 115 formed at side portions of the gate electrode 113 in the semiconductor substrate 101, and a first conductive type second ion implantation region 117 formed at side portions of the emitter ion implantation region 115 in the first deep ion implantation region 111. In this manner, by forming the first deep ion implantation region 111 to face towards the open area of the collector ion implantation region 105, the hole current injected into the base region 109 under the emitter ion implantation region 115, which is the most common cause of latch-up, decreases, and the hole current injected into the first deep ion implantation region 111 having no latch-up effect relatively increases, thereby greatly increasing the latch-up current level.

In addition, the lateral insulated-gate bipolar transistor in accordance with embodiments may include a first insulation layer 119 formed on and/or over the top surface of the semiconductor substrate 101 including the gate electrode, a contact 127 formed to penetrate the first insulation layer 119 and the closed area of the buried insulation layer 107 and make contact with the collector ion implantation region 105, an emitter electrode 129 electrically connected to the emitter ion implantation region 115, and a collector electrode 131 electrically connected to the contact 127.

Example FIGS. 3 to 9 are cross-sectional views illustrating a method for manufacturing a lateral insulated-gate bipolar transistor in accordance with embodiments.

Hereinafter, the method for manufacturing a lateral insulation gate bipolar transistor in accordance with embodiments will be described with reference to example FIGS. 3 to 9. In what follows, for convenience of explanation, the first conductive type semiconductor substrate 101, second conductive type drift region 103, first conductive type collector ion implantation region 105, first conductive type base region 109, first conductive type first ion implantation, region 111, second conductive type emitter ion implantation region 115, and first type conductive second ion implantation region 117 may respectively be referred to as the P-type semiconductor substrate 101, N-type drift region 103, P-type collector ion implantation region 105, P-type base region 109, P-type first ion implantation region 111, N-type emitter ion implantation region 115, and P-type second ion implantation region 117. As such, in the present disclosure, the "first conductive type" means a P-type and the "second conductive type" means an N-type, but in other embodiments, the "first conductive type" may mean an N-type and the "second conductive type" may mean a P-type.

Figure 3:
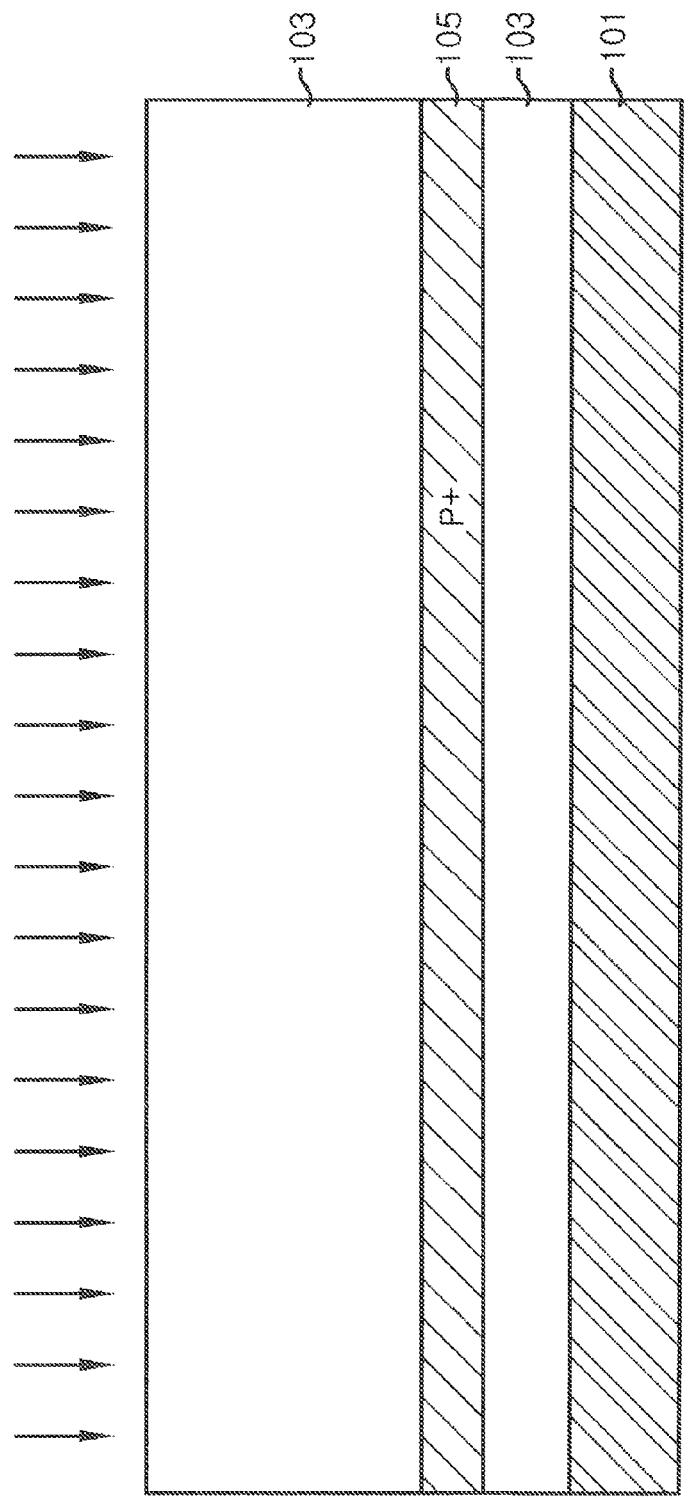

First, as illustrated in example FIG. 3, a lightly doped N-type silicon active layer may be formed in the P-type semiconductor substrate 101 to form an N-type drift region 103, and P-type impurity ions may be injected into the N-type drift region 103 to form a P-type collector ion implantation region 105 at a preset depth in the N-type drift region 103.

Figure 4:
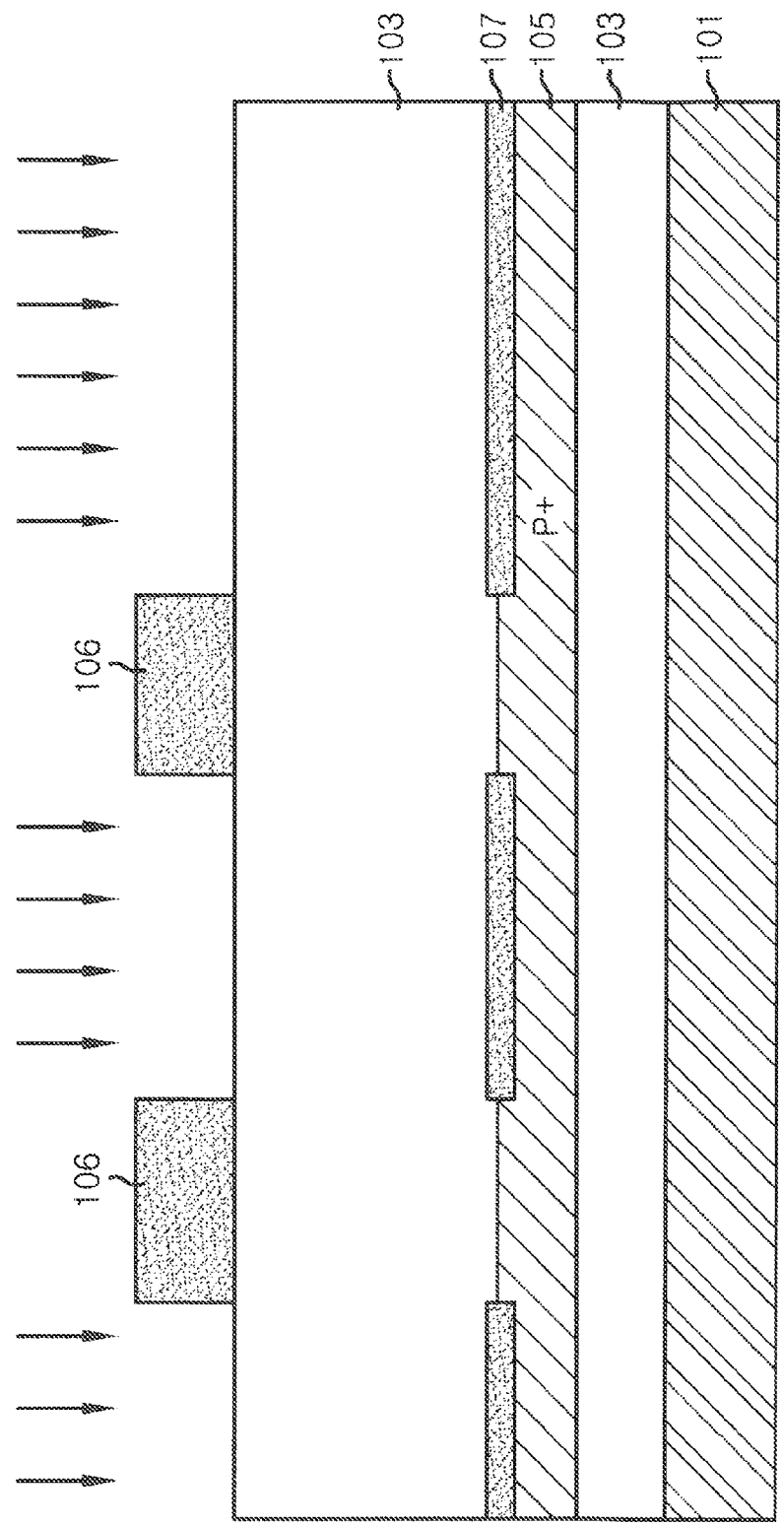

Next, as illustrated in example FIG. 4, a mask pattern 106 serving as an ion implantation mask during an ion implantation process may be formed on and/or over the semiconductor substrate 101, and a buried insulation layer 107 having an open area and a closed area may be formed on and/or over the interface between the top surface of the collector ion implantation region 105 and the drift region 103 by performing the ion implantation process using the mask pattern 106 as the ion implantation mask. For example, the mask pattern 106 may be a photoresist pattern, and a silicon oxide film $SiO_2$ may be formed to serve as the buried insulation layer 107 by performing an ion implantation process using oxygen ions and an anneal process. Thereafter, the mask pattern 106 may be removed.

In this manner, only part of the collector ion implantation region 105 is opened and the other regions are isolated, thereby reducing the turn-off time, which is in a trade-off relationship with the forward voltage drop characteristic.

Figure 5:
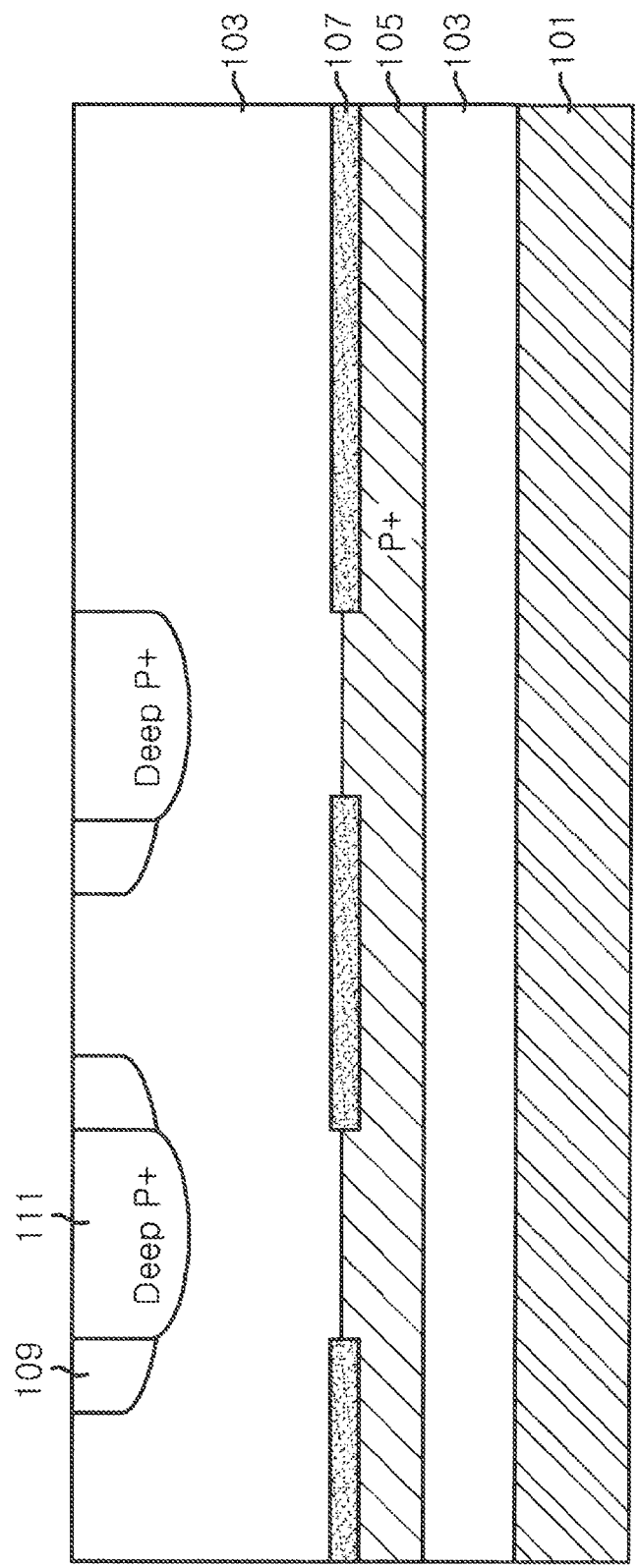

Next, as illustrated in example FIG. 5, a P-type base region 109 may be formed above the open area of the collector ion implantation region 105 where the buried insulation layer 107 is not formed in the semiconductor substrate 101. For example, the P-type base region 109 may be formed by forming a mask pattern serving as an ion implantation mask during an ion implantation process on top of the semiconductor substrate 101 and then implanting P-type impurity ions by the ion implantation process using the mask pattern as the ion implantation mask.

Subsequently, a P-type deep first ion implantation region 111 may be formed in the base region 109 so as to be aligned with the open, area of the collector ion implantation region 105 where the buried insulation layer 107 is not formed. For example, the first ion implantation region 111 may be formed by forming a mask pattern serving as an ion implantation mask in an ion implantation process on top of the semiconductor substrate 101 and then, implanting highly doped P-type impurity ions by the ion implantation process using the mask pattern as the ion implantation mask.

Figure 6:
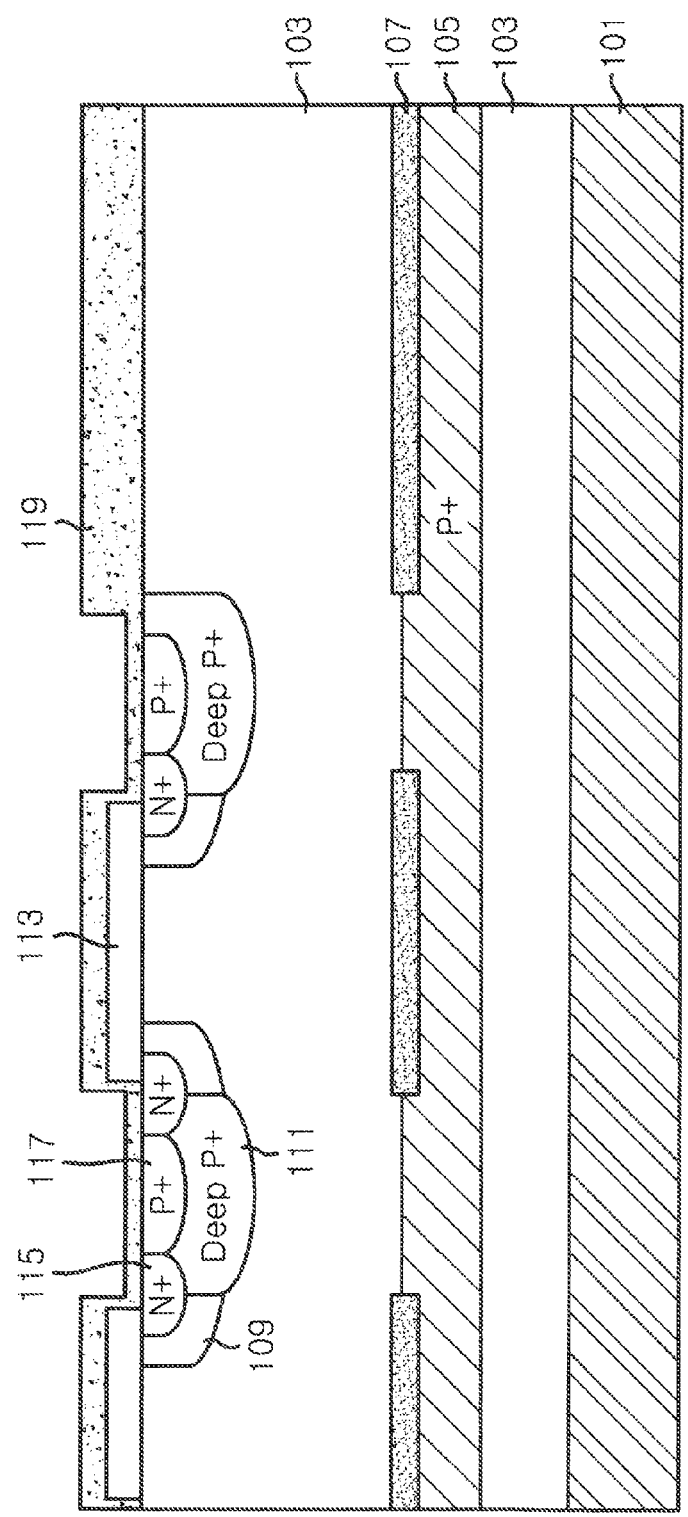

Next, as illustrated in example FIG. 6, a gate electrode 113 may be formed between and adjacent to the base region 109 on and/or over the semiconductor substrate 101. For example, the gate electrode 113 may be formed by interposing a gate insulation film (not shown) on and/or over the top surface of the semiconductor substrate 101, and depositing a polysilicon layer or metal layer thereon and/or thereover and patterning it.

Subsequently, an N-type emitter ion implantation region 115 may be formed at side portions of the gate electrode 113 in the semiconductor substrate 101, and a P-type second ion implantation region 117 may be formed at side portions of the emitter ion implantation region 115 in the first ion implantation region 111. For example, the emitter ion implantation region 115 may be formed by forming a mask pattern serving as an ion implantation mask during an ion implantation process on top of the semiconductor substrate 101 and performing the ion implantation process using the mask pattern as the ion implantation mask, and then the second ion implantation region 117 may be formed by performing an ion implantation process using a modified mask pattern.

Thereafter, a first insulation layer 119 may be formed on and/or over the semiconductor substrate 101 where the second ion implantation region 117 is formed. For example, the first insulation layer 119 may be formed by depositing an oxide film.

By virtue of the emitter region having the structure as illustrated in example FIG. 6, by forming the first deep ion implantation region 111 to face towards the open area of the collector ion implantation region 105, the hole current injected into the base region 109 under the emitter ion implantation region 115, which is the most common cause of latch-up, decreases, and the hole current injected into the deep, first ion implantation region 111 having no latch-up effect relatively increases, thereby greatly increasing the latch-up current level.

Figure 7:
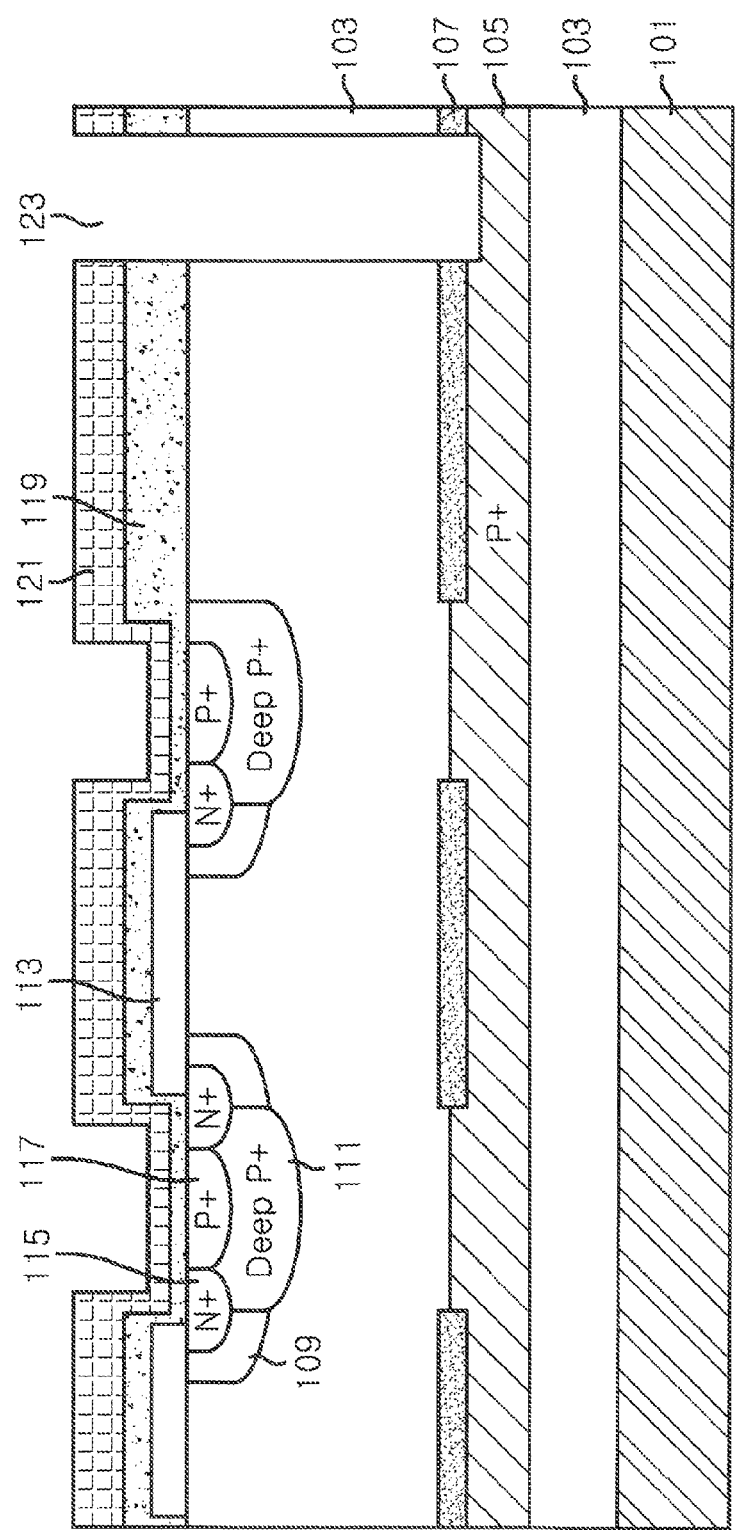

Next, as illustrated in example FIG. 7, a second insulation layer 121 may be laminated over the first insulation layer 110. For example, the second insulation layer 121 may be formed by depositing a nitride film.

Then, a contact hole 123 opening the collector ion implantation region 105 may be formed by penetrating the second insulation layer 121, the first insulation layer 119, and the closed area of the buried insulation layer 107. For example, the contact hole 123 may be formed by forming a hard mask pattern opened only in a region where the contact hole 123 is to be formed on and/or over the semiconductor substrate 101 and then performing an etching process. The collector ion implantation region 105 may be used as an etching stop film.

Figure 8:
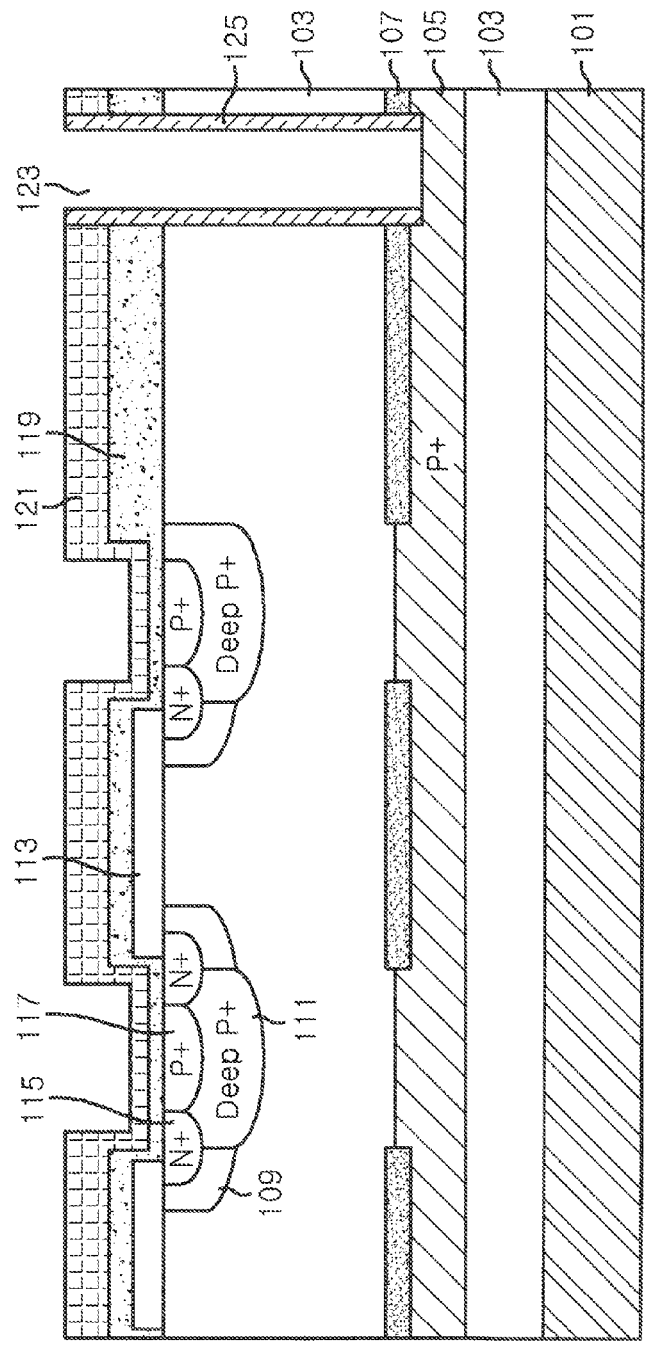

Subsequently, as illustrated in example FIG. 8, a sidewall 125 may be formed within the contact hole 123. For example, the sidewall 125 may be formed by forming an oxide film within the contact hole 123 and then removing the oxide film existing on the bottom surface of the contact hole 123.

Figure 9:
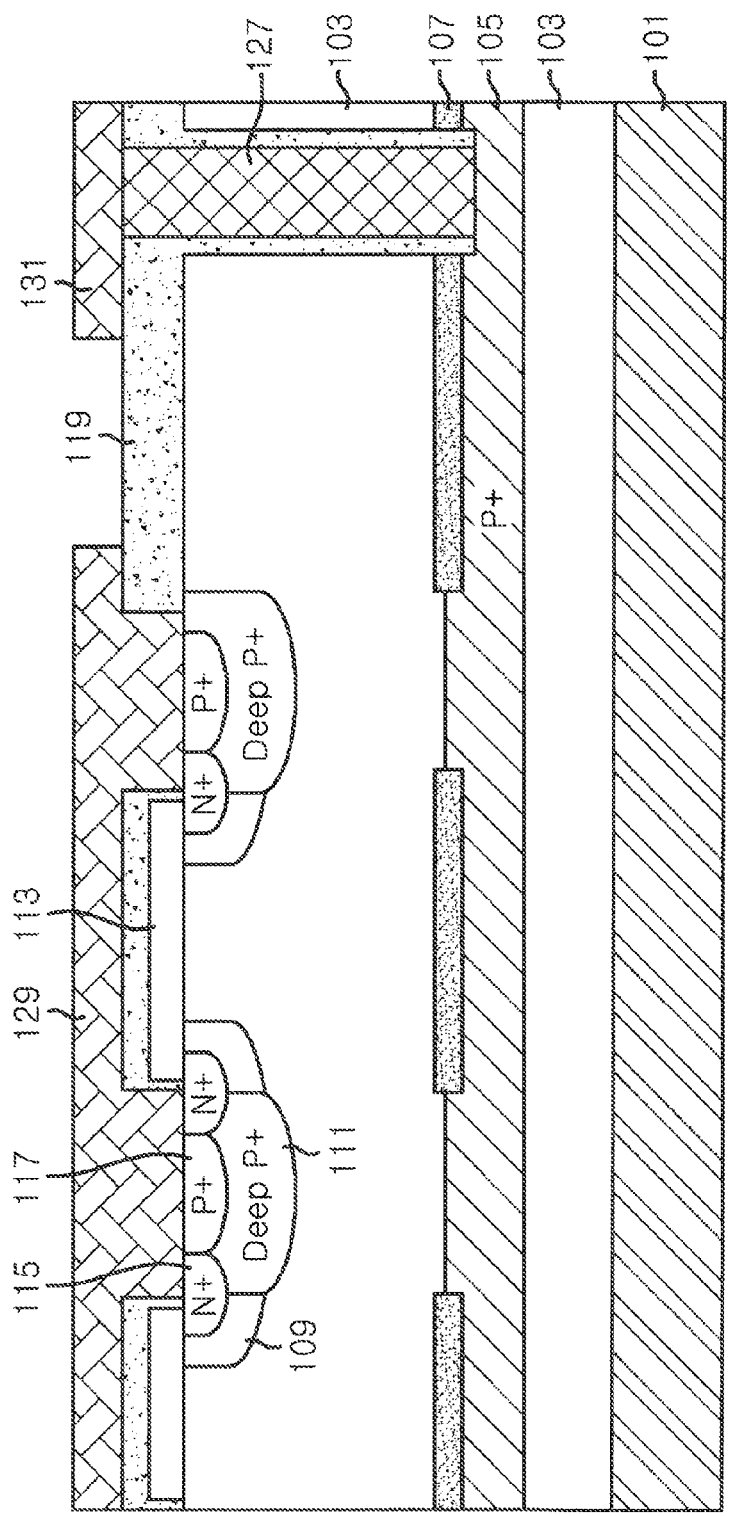

Referring to example FIG. 9, a contact 127 may be formed by burying the contact hole 123 in which the sidewall 125 is formed while removing the second insulation layer 121. For example, the contact 127 may be formed by burying the contact hole 123 with a metal material and then performing a planarization process such as chemical mechanical polishing (CMP) or the like until the second insulation layer 121 is removed.

In addition, an emitter electrode 129 electrically connected to the emitter ion implantation region 115 may be formed, and a collector electrode 131 electrically connected to the contact 127 may be formed. For example, the emitter electrode 129 and the collector electrode 131 may be formed together by depositing a metal layer on and/or over the semiconductor substrate 101 and then patterning it.

In accordance with embodiments, with the use of a structure in which a buried insulation layer is formed inside a semiconductor substrate, only part of the collector ion implantation region is opened and the other regions are isolated, thereby reducing the loss by the turn-off time, which is in a trade-off relationship with a forward voltage drop characteristic.

Further, by forming the deep ion implantation region to face towards the open area of the collector ion implantation region, the hole current injected into the base region under the emitter ion implantation region, which is the most common cause of latch-up, decreases, and the hole current injected into the deep, first ion implantation region having no latch-up effect relatively increases, thereby greatly increasing the latch-up current level.

While embodiments have been shown and described, it will be understood by those skilled in the art that various changes and modifications may be made without departing from the scope of the embodiments as defined in the following claims.

What is claimed is:

1. A lateral insulated-gate bipolar, transistor, comprising:
   a first conductive type semiconductor substrate;
   a second conductive type drift region formed in the first conductive type semiconductor substrate;
   a first conductive type collector ion implantation region formed at a preset depth in the second conductive type drift region;
   a buried insulation layer formed to have at least one open area and at least one closed area on an interface between a top surface of the collector ion implantation region and the drift region;
   a first conductive type base region formed to face towards a first open area of the at least one open area in the semiconductor substrate;
   a gate electrode formed between adjacent first conductive type base regions on the semiconductor substrate;
   a second conductive type emitter ion implantation region formed at side portions of the gate electrode in the semiconductor substrate;
   an insulation layer formed on a top surface of the semiconductor substrate including the gate electrode,
   a contact formed to penetrate the insulation layer and a first closed area of the at least one closed area of the buried insulation layer and contacting the collector ion implantation region;

an emitter electrode electrically connected to the emitter ion implantation region; and a collector electrode electrically connected to the contact.

2. The lateral insulated-gate bipolar transistor of claim 1, further comprising:

a first conductive type first ion implantation region formed in the first conductive type base region so as to be aligned with the first open area.

3. The lateral insulated-gate bipolar transistor of claim 2, further comprising:

a first conductive type second ion implantation region formed at side portions of the emitter ion implantation region in the first ion implantation region.

4. The lateral insulated-gate bipolar transistor of claim 1, wherein the buried insulation layer comprises an oxide film.

5. A method for manufacturing a lateral insulated-gate bipolar transistor, the method comprising:

forming a second conductive type drift region in a first conductive semiconductor substrate;

forming a first conductive type collector ion implantation region at a preset depth in the second conductive drift region;

forming a buried insulation layer having at least one open area and at least one closed area on an interface between a top surface of the collector ion implantation region and the drift region;

forming a first conductive type base region to face towards a first open area of the at least one open area in the semiconductor substrate;

forming a gate electrode between adjacent first conductive type base regions on the semiconductor substrate;

forming a second conductive type emitter ion implantation region at side portions of the gate electrode in the semiconductor substrate;

forming an insulation layer on a top surface of the semiconductor substrate including the gate electrode, forming a contact which penetrates the insulation layer and a first closed area of the at least one closed area of the buried insulation layer and makes contact with the collector ion implantation region; and forming an emitter electrode electrically connected to the emitter ion implantation region; and forming a collector electrode electrically connected to the contact.

6. The method of claim 5, further comprising:

after forming the first conductive type base region, forming a first conductive type first ion implantation region in the first conductive type base region so as to be aligned with the first open area.

7. The method of claim 6, further comprising:

after forming the emitter ion implantation region, forming a first conductive type second ion implantation region at side portions of the emitter ion implantation region in the first ion implantation region.

8. The method of claim 5, wherein the forming the buried insulation layer comprises:

forming a mask pattern defining the at least one open area and the at least one closed area on top of the semiconductor substrate; and implanting oxygen ions in the at least one closed area using the mask pattern to form the buried insulation layer.

\* \* \* \* \*